United States Patent [19]

Linn et al.

[11] Patent Number: 5,517,047
[45] Date of Patent: May 14, 1996

[54] BONDED WAFER PROCESSING

[75] Inventors: Jack H. Linn, Melbourne; Robert K. Lowry, Melbourne Beach; George V. Rouse, Indiatlantic, all of Fla.; James F. Buller, Austin, Tex.; William H. Speece, Palm Bay, Fla.

[73] Assignee: Harris Corporation, Melbourne, Fla.

[21] Appl. No.: 287,773

[22] Filed: Aug. 9, 1994

Related U.S. Application Data

[62] Division of Ser. No. 921,197, Jul. 28, 1992, Pat. No. 5,362,667.

[51] Int. Cl.$^6$ .................................... H01L 27/01
[52] U.S. Cl. ................ 257/347; 257/349; 257/639
[58] Field of Search ........................ 257/347, 639, 257/649, 524, 525, 526, 349

[56] References Cited

U.S. PATENT DOCUMENTS

| | | | |
|---|---|---|---|
| 4,878,957 | 11/1989 | Yamaguchi et al. | |
| 5,187,636 | 2/1993 | Nakao | 257/639 |
| 5,236,546 | 8/1993 | Mizutani | 156/620.71 |
| 5,241,211 | 8/1993 | Tashiro | 257/347 |
| 5,294,821 | 3/1994 | Iwamatsu | 257/347 |
| 5,322,589 | 6/1994 | Matsuoka et al. | 437/173 |
| 5,362,667 | 11/1994 | Linn et al. | 437/62 |
| 5,387,555 | 2/1995 | Linn et al. | 437/225 |
| 5,442,223 | 8/1995 | Fujii | 257/649 |

FOREIGN PATENT DOCUMENTS

| | | | |
|---|---|---|---|
| 56-58269 | 5/1981 | Japan | 257/649 |
| 2-18961 | 1/1990 | Japan. | |

OTHER PUBLICATIONS

Burkhardt, "Composite Silicon Dioxide–Silicon Oxynitride Insulating Layer," IBM Technical Disclosure Bulletin, vol. 13, No. 1, Jun. 1970, p. 21.

Haisma, et al., "Silicon–on–Insulator Wafer Bonding–Wafer Thinning Technological Evaluations", *Japanese Journal Appl. Phys.*, vol. 28, No. 8, 1989, Japan.

*Primary Examiner*—Sara W. Crane
*Assistant Examiner*—Courtney A. Bowers
*Attorney, Agent, or Firm*—Nixon, Hargrave, Devans & Doyle

[57] ABSTRACT

Low temperature wafer bonding using a silicon-oxidizing bonding liquid permits introduction of radiation hardening dopants and electrically active dopants as constituents of the bonding liquid. Oxidizers such as nitric acid may be used in the bonding liquid. Dielectric layers on the device wafer and the handle wafer may be used when additional silicon is provided for the oxidative bonding. Integrated circuits fabricated from such bonded wafers may have buried layers and radiation hardening with device silicon too thick for implantation.

5 Claims, 9 Drawing Sheets

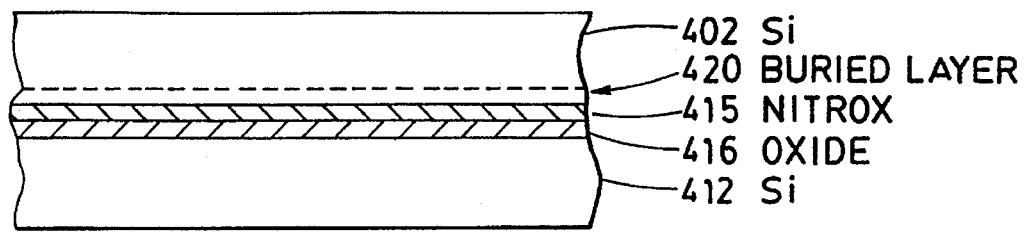
FIG. 4
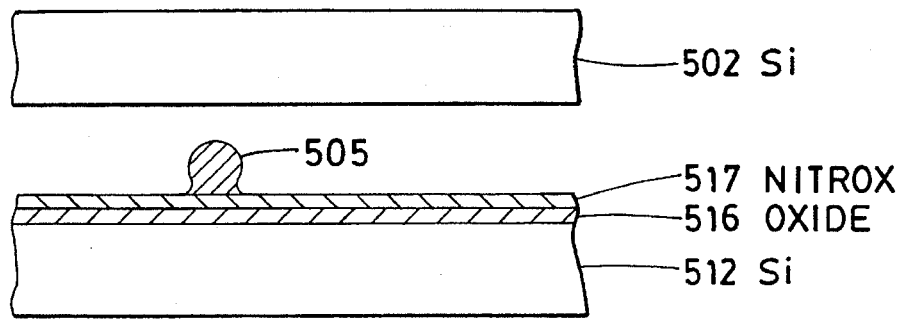
FIG. 5a
FIG. 5b
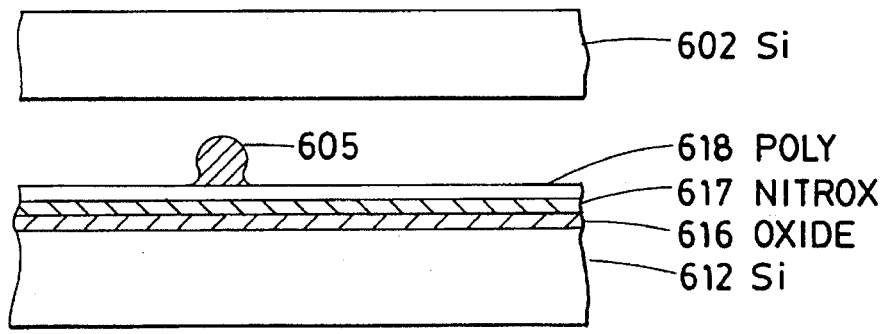
FIG. 6

BONDED WAFER PROCESSING

This is a division of application Ser. No. 07/921,197 filed on Jul. 28, 1992, U.S. Pat. No. 5,362,667.

BACKGROUND AND SUMMARY OF THE INVENTIONS

The present invention relates to electronic integrated circuits and methods of fabrication, and, more particularly, to dielectrically isolated semiconductor integrated circuits and related fabrication methods.

SILICON-ON-INSULATOR SUBSTRATES

Integrated circuits fabricated in silicon-on-insulator substrates offer performance advantages including freedom from latchup for CMOS structures, high packing density, low parasitic capacitance, low power consumption, radiation hardness, high voltage operation, and the possibility of three dimensional integration. Indeed, isolation trenches extending through the silicon layer down to the insulation provide a simple approach to dielectric isolation of integrated circuit devices. The sidewalls of such trenches are coated with an insulator, usually silicon dioxide ("oxide"), and the remaining portion of trench opening, if any, is filled with a filler which is usually polycrystalline silicon. Diffused PN junctions can also be used for lateral isolation.

Additionally, silicon-on-insulator technology using very thin films offers special advantages for submicron devices. Scaling bulk devices tends to degrade their characteristics because of small-geometry effects, such as punch-through, threshold voltage shift, and subthreshold-slope degradation. The use of silicon-on-insulator devices suppresses these small-geometry effects. Therefore, even in the submicron VLSI era, silicon-on-insulator technology can offer even higher device performance than can bulk technology, along with the inherent advantages of silicon-on-insulator.

Silicon-on-insulator substrates may be fabricated in various ways: a crystalline silicon layer may be formed over an existing oxide layer either by laser or strip heater recrystallization of polysilicon deposited on the oxide or by selective epitaxial silicon growth over the oxide. However, the quality of such a silicon layer is generally inferior to that normally associated with bulk silicon. Other approaches form an oxide layer beneath an existing high quality silicon layer either by oxidizing a buried porous silicon layer or by oxygen ion implantation; however, such oxide is low quality and the silicon top layer may be damaged during the oxide layer formation.

Another approach to silicon-on-insulator is wafer bounding as described by J. Lasky et al., Silicon-On-Insulator (SOI) by Bonding and Etch-Back, 1985 IEDM Tech. Deg. 684. This wafer bonding process proceeds as follows: a lightly doped epitaxial layer of silicon is grown on a heavily doped silicon substrate, oxide is thermally grown on the epilayer, a second lightly doped silicon substrate is thermally oxidized, the two oxidized surfaces are pressed together. See FIG. 1a. The pressed together wafers are inserted into an oxidizing atmosphere at 1,100° C. to bond them as illustrated in FIG. 1b. Lastly, a preferential etch is used to remove the heavily doped substrate, leaving the thin, lightly doped epitaxially layer above the bonded thermally grown oxides which are now on the second substrate as shown in FIG. 1c. The resulting thin silicon layer above thermally grown oxide has high quality and the oxide also retains its quality and may be thick, as might be desired for CMOS or high voltage devices, or then, as might be desired for shared element applications. FIG. 1d heuristically illustrates trench isolation with poly filled trenches isolating MOSFET and bipolar devices.

Conceptually, this process may meet all the desired goals for the ultimate silicon-on-insulator material (a specular finished crystalline silicon layer without dislocations and a back interface with the insulator of quality equal to the interface of thermally grown silicon dioxide on silicon; both the crystalline silicon layer and the insulator of variable thickness).

Another wafer bonding method, illustrated in FIGS. 2a–c and described in copending U.S. patent application Ser. No. 07/834,439, filed Feb. 12, 1992, U.S. Pat. No. 5,266,135, proceeds as follows. Start with a device wafer having a lightly doped epilayer on a heavily doped substrate and a handle wafer with a thick (4,000 A) oxide layer. Activate the surface of the device wafer with an acid or peroxide wash to enhance hydroxyl group formation. Place a drop of oxidant such as water plus hydrogen peroxide on the oxide, and squeeze the wafers together. See FIG. 2a. The drop of oxidant has a volume in the range of 0.8 to 8.0 microliters per square inch of wafer surface. Dry the squeezed wafers at room temperature for a day and then heat the squeezed wafers to 1150 degrees C. for two hours. The heating drives an oxidation of the device wafer and the silicon-oxygen bonds formed fuse the two wafers. See FIG. 2b. Lastly, grind and etch the device wafer until exposure of the device epilayer. This completes the silicon-on-insulator substrate as shown in FIG. 2c. For applications requiring a thick (10–60 μm) silicon-on-insulator layer and a thicker (e.g., 4 μm) bottom oxide, but allowing some tolerance in the layer thickness, a slightly simpler process could be used. A uniformly lightly doped device wafer could be used, and the thinning process could be just grinding and polishing.

However, bonded wafers have problems with the buried oxide not being radiation hardened without an implant through the device layer. And an implant would only be applicable to device layers with thicknesses of up to about 2–3 μm. It has been demonstrated that implanting electronegative elements, like nitrogen, will enhance radiation tolerance. Implanting these dopants can be a problem in that silicon crystal defects are created in the device layer during implant. High temperature annealing can "heal" many of these implant defects, however, a great deal of thermal processing is required and some defects will remain.

Implanting dopants can also result in conducting "pipes" within the buried dielectric. These can be caused by particulates on the surface of the wafer preventing the correct dopant concentration from being implanted to produce a stoichiometric dielectric.

It is also difficult to control any doped buried layers introduced into the silicon prior to wafer bonding due to the high temperature of the bonding process and subsequent anneals.

Bonded wafers also have inherent stresses which can result in cracked or debonded areas due to mismatches in coefficients of thermal expansion between the substrate layers and bonding layer.

Bonded waters with silicon dioxide buried layers are also susceptible to contaminant diffusion as oxides are poor diffusion barriers to mobile ions like sodium. Contaminants introduced during the bonding process can easily diffuse to the device layer interface and result in electrical stability problems.

3

Features

The present invention provides bonded wafer processing with the features of (1) relatively low temperature bonding by the use of low temperature, chemical oxidizers, (2) dielectric hardening by the use of chemical dopants directly in the bonding liquid without the use of high energy, silicon damaging implants, (3) better stress compensation by providing dopants in the bonding liquid which will produce a bonding layer which has closely matched coefficients of thermal expansion to that of the substrate wafers, (4) limiting contaminant migration by the use of dopants in the bonding liquid which will produce a bonding layer which is a barrier to diffusion of mobile contaminants, (5) a method of simultaneously producing a buried doped layer in the silicon during the bonding process, and (6) a method of producing a bonded wafer with a multi-level buried dielectric sandwich from pre-deposited dielectric layers on both wafers.

BRIEF DESCRIPTION OF THE DRAWINGS

The present invention will be described with reference to the accompanying drawings, which are schematic for clarity:

FIG. 4 shows a third preferred embodiment method;

FIGS. 5a–b are cross sectional elevation views of a fourth preferred embodiment;

FIGS. 6–8 illustrate further preferred embodiment methods; and

DESCRIPTION OF THE PREFERRED EMBODIMENTS

Method with nitrogen

Figure 1A:
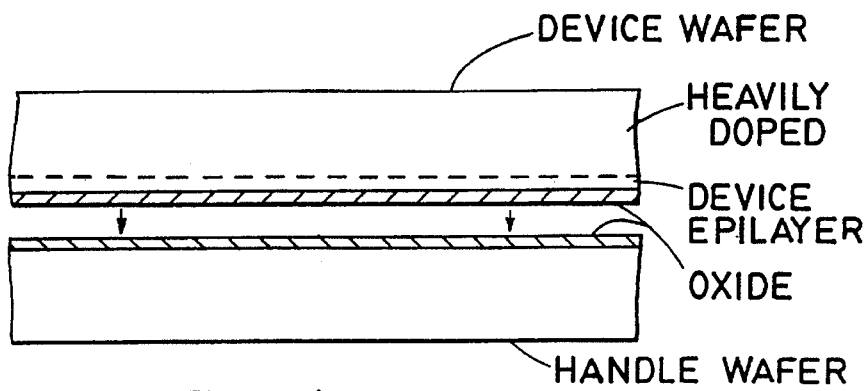
FIGS. 1a–d illustrate in cross sectional elevation views known wafer bonding methods and integrated circuits.
Figure 1B:
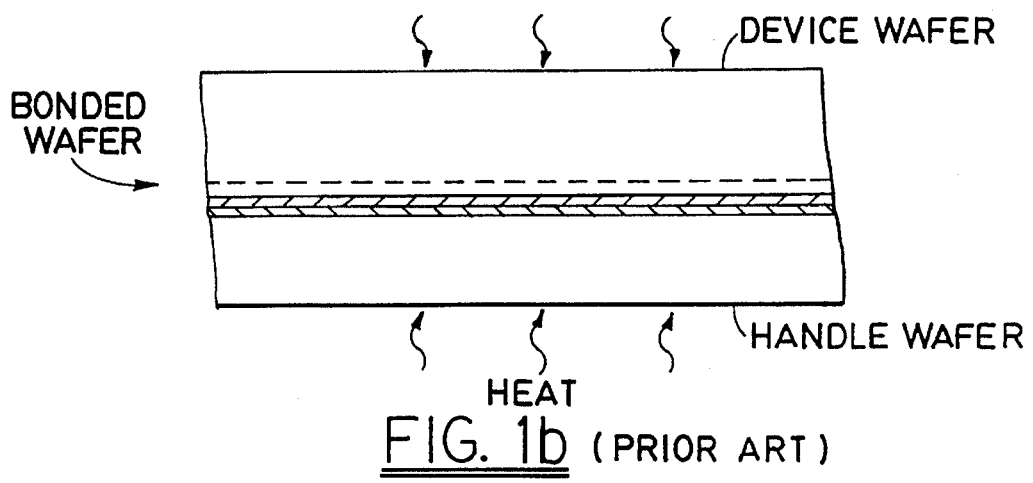
Figure 1C:
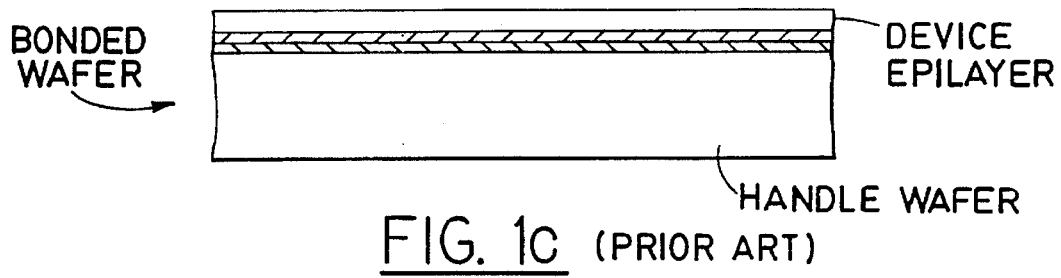
Figure 1D:
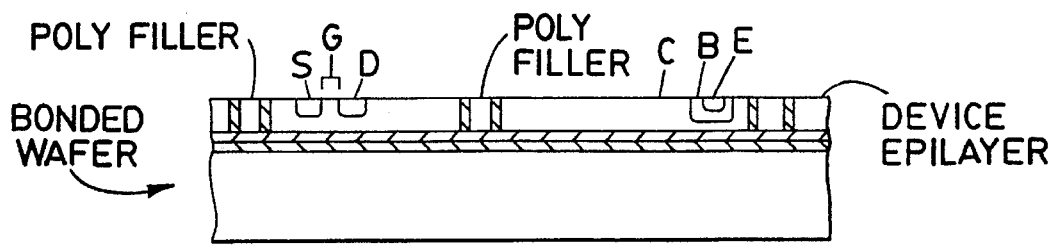

FIGS. 3a–e illustrate in cross sectional elevation view a first preferred embodiment method of bonded wafer processing.

(a) Begin with a four inch diameter 500 μm thick silicon device wafer 302 and a comparable diameter 500 μm thick silicon handle wafer 312. Device wafer 302 has the doping type and resistivity (e.g., N type and 20 ohm-cm resistivity) desired for eventual device fabrication and has only native oxide on its surfaces. Thermally oxidize handle wafer 312 to form oxide layers 314 and 316. Oxide 316 will become the bottom oxide, so the oxide is grown to the desired bottom oxide thickenss; for example, 4 μm. Oxide 314 provides stress compensation to restrain warpage. Place drop 305 of oxidizing aqueous solution of $HNO_3$ and $H_2O_2$ on oxide 316; see FIG. 3a. Drop 305 is 20% by volume a 67% $HNO_3$ solution and 80% by volume a 30% $H_2O_2$ solution. Other mixtures also work. Drop 305 has a volume of about 0.05 cc which implies 4.0 microliters per square inch of wafer surface and theoretically will spread out to a layer with thickness (if uniform) of 6 μm

4 on oxide 316. Note that drop 305 wets the surface of oxide 316. (Drop volume in the range of 4 to 10 microliters per square inch of wafer surface provides good bonding.) A buried layer in the final device structures will be formed as part of the bonding process, so device wafer 302 does not require an implant.

(b) Press handle wafer 312 and device wafer 302 together with drop 305 of first preferred embodiment oxidizer on the surface of oxide 316. Let the pressed together wafers dry for 24 hours and then heat them to 800°–1000° C. in a 2–6 hour furnace cycle with an oxidizing ambient. This low temperature bonding does not depend entirely on oxidation as in the process of FIGS. 2a–c, but is coupled with an oxidation reduction reaction of nitrate oxidizing the silicon of wafer 302 coupled with slow thermal oxidation. See FIG. 3b. The nitrate forms both silicon-oxygen and silicon-nitrogen bonds, and the water primarily evaporates. The reactions basically are:

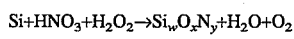

$$Si+HNO_3+H_2O_2 \rightarrow Si_wO_xN_y+H_2O+O_2$$

This creates bonded zone 315 of a mixture of silicon oxynitrides ("nitrox") connecting the remainder of device wafer 302 to oxide 316 and handle wafer 312. Bonded zone nitrox 315 has a thickness of roughly 500–800 Å and average values of x and y of roughly 0.8 and 0.2, respectively. FIG. 3h shows a SIMS (secondary ion mass spectroscopy) profile of the bonded wafer structure with nitrox apparent between the oxide (lefthand portion of FIG. 3h) and the silicon (center and righthand portion). FIG. 3i shows for comparison a SIMS profile of a bonded wafer made by the process of FIGS. 2a–c and with nitrogen implanted to the oxide-silicon interface. The nitrox in FIG. 3h is confined to a 500–800 Å, thick bonding zone and avoids the long nitrogen tails due to implantation straggle apparent in FIG. 3i. Of course, increasing the ratio of $HNO_3$ to $H_2O_2$ will increase x and decrease y and somewhat increase the thickness of bonded zone nitrox 315; and conversely for a decrease in the ratio.

(c) After bonding, remove the bulk of device wafer 302 by grinding, lapping, and polishing to leave the desired device island thickness; for example, 35–40 μm. This thinning of device wafer 302 proceeds without any etchstop, so the final thickness of device wafer 302 depends upon process control. See FIG. 3c. The use of an etchstop permits much smaller device island thicknesses, such as 1 μm.

(d) Thermally grow mask oxide 326 on device wafer 302 to a thickness of about 4 μm, this increases backside oxide 314 on handle wafer 312 to about 4.5 μm but will not affect bond nitrox layer 315 or bottom oxide layer 316. Mask oxide 326 will be used as a trench etch mask. See FIG. 3d.

(e) Print a trench pattern into photoresist spun onto mask oxide 326. Note that the bottom oxide 316 (4 μm), the mask oxide 326 (4 μm) and the backside oxide 314 (4.5 μm) are all fairly closely matched in thickness during the photoresist patterning, and bond nitrox layer 315 is fairly thin. This provides a rough stress balance and limits warpage of the bonded wafers. Use the patterned photoresist as etch mask to wet etch (HF) the trench pattern in oxide 326. The wet etch removes 4 μm from backside oxide 314 to leave only 0.5 μm. Then strip the photoresist and use the patterned oxide 326 to plasma reactive ion etch (RIE) device wafer 302 to form silicon islands 322, 323, . . . on bond nitrox layer 315. See FIG. 3e.

Figure 3A:
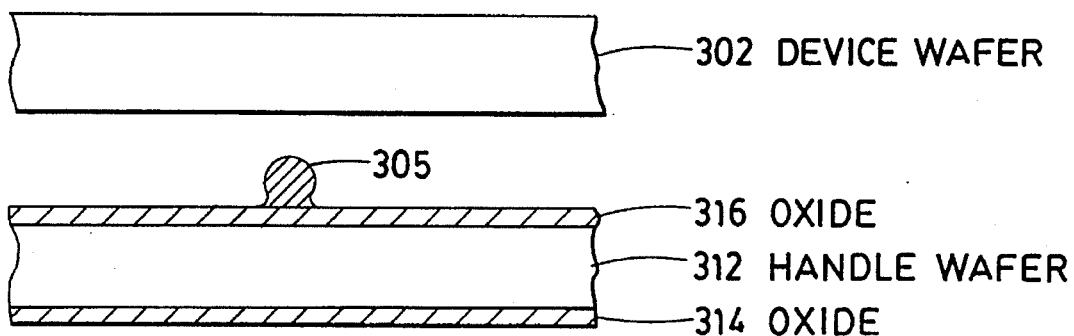
FIGS. 3a–i are cross sectional elevation views of a first preferred embodiment method of wafer bonding and a SIMS profile of the result plus a comparison SIMS profile.
Figure 3B:
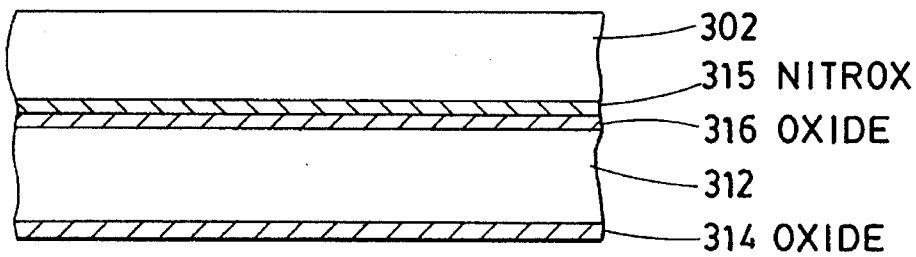
Figure 3C:
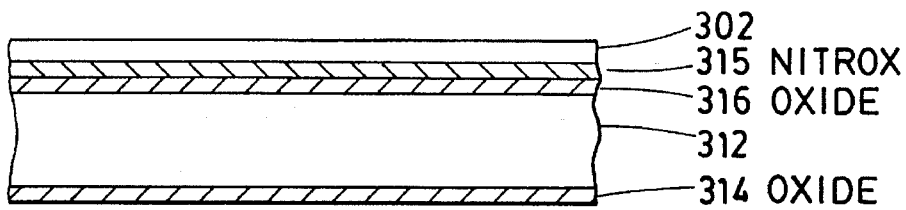
Figure 3D:
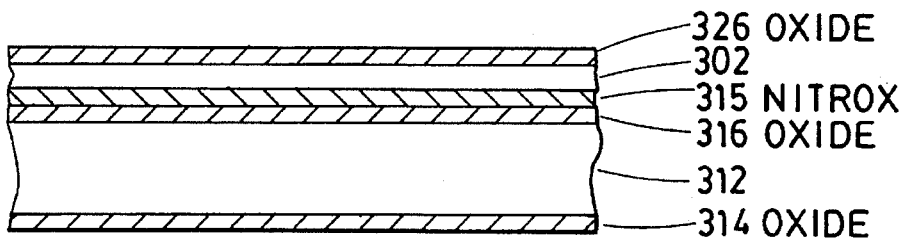
Figure 3E:
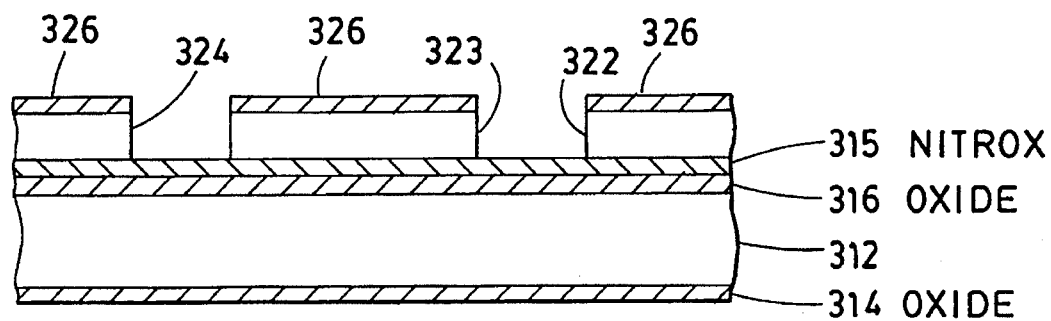
Figure 3F:
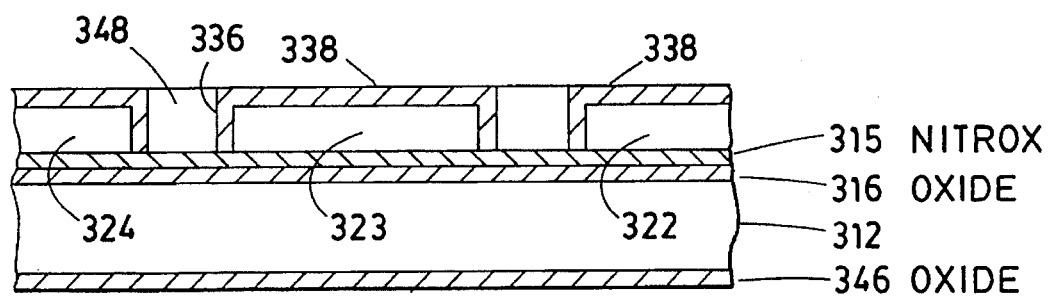

(f) Strip patterned oxide 326 with a wet etch. This etch also removes the remaining backside oxide 314 on the back of handle wafer 312. Then thermally grow oxide to a thickness of 4 μm to form isolation oxide 336 on the sides of islands 322, 323, ... This also forms 4 μm of oxide 338 on the island surfaces and 4 μm of backside oxide 346 on handle wafer 312. Next, deposit polysilicon 348 to fill the trenches. Lastly, planarize to remove the polysilicon except from the trenches. See FIG. 3f. Note that again the island surface oxide 338, bottom oxide 316, and backside oxide 346 all have about the same thickness (4 μm).

Figure 3G:
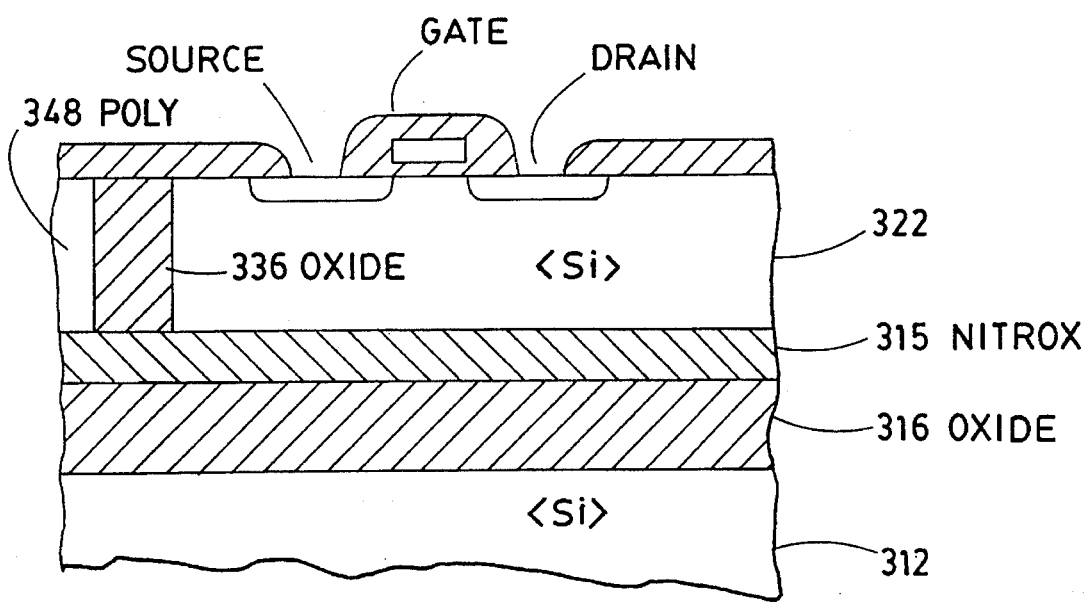

(g) Fabricate devices in islands 322, 323, ... with repeated cylces of (1) thermally grow oxide layer, (2) spin on photoresist using a spinner vacuum chuck, (3) pattern the photoresist using an aligner vacuum chuck, (4) wet etch the oxide using the patterned photoresist as etch mask, (5) and diffuse or implant or etch silicon using the patterned oxide as diffusion/implant/etch mask. FIG. 3g illustrates in magnified view a partially completed MOSFET in island 322 which would be just one of thousands of such devices in an integrated circuit fabricated on the bonded wafer.

An advantage of silicon-on-insulator integrated circuits with devices overlying bond nitrox layer 315 rather than just bottom oxide layer 316 lies in their radiation hardness. Radiation affects a typical silicon-on-oxide structure by generating positive charges at the silicon-oxide interface. These positive charges will shift a MOSFET threshold due to the body effect. However, nitrogen in nitrox layer 315 will neutralize positive charges at the interface.

Also, nitrox layer 315 has a higher dielectric constant than bottom oxide layer 316. In fact, the dielectric constant of nitride is about 7.9 and that of oxide is about 3.9.

Figure 2A:
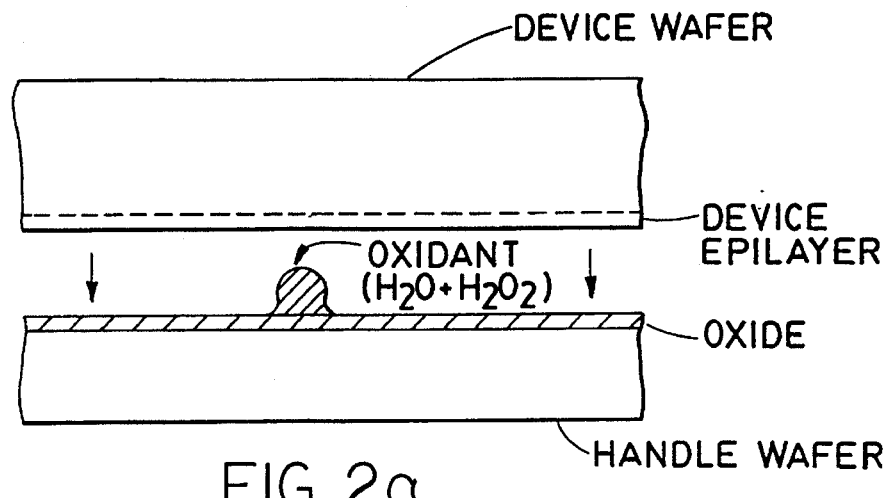
FIGS. 2a–c illustrate in cross sectional elevation views a copending wafer bonding method.
Figure 2B:
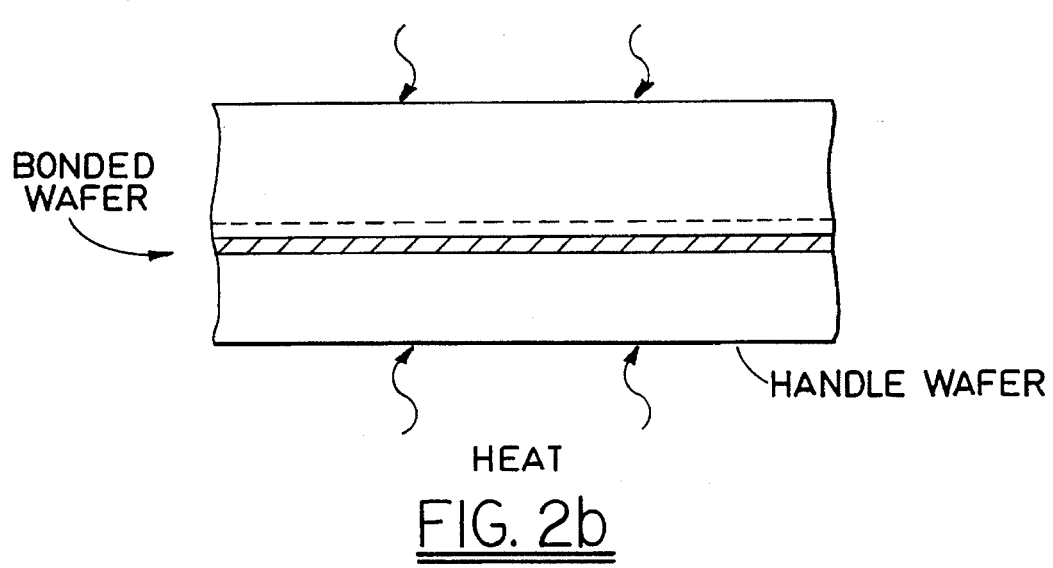
Figure 2C:
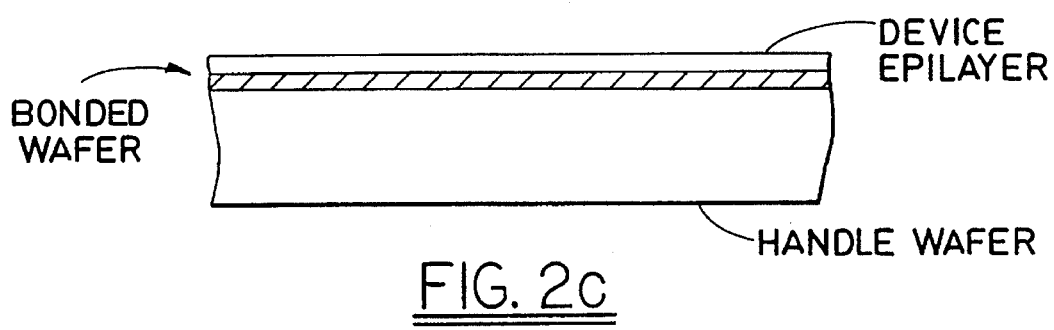
Figure 3I:
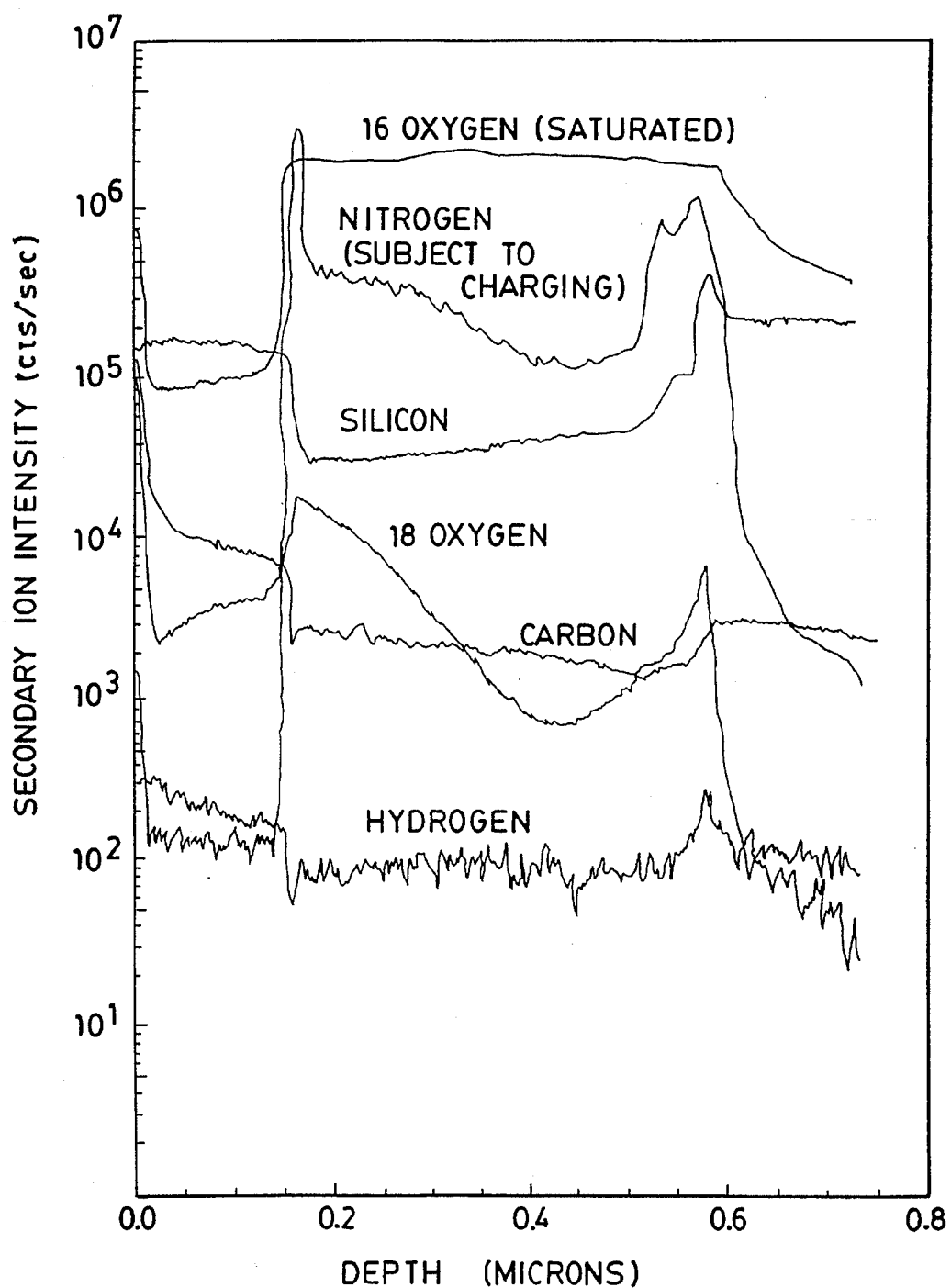
Figure 3H:
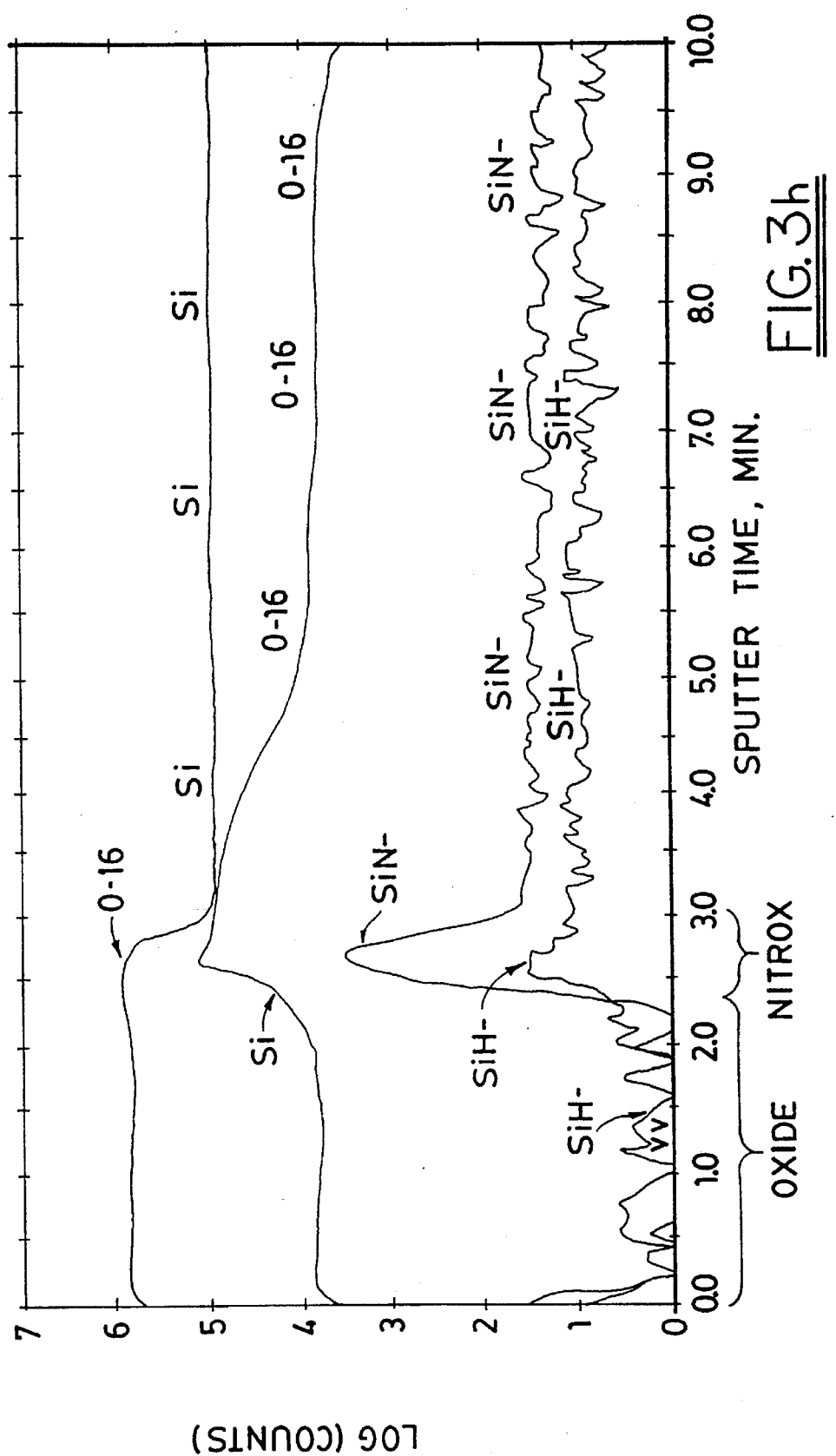

Experimental bonding temperatures of 850° C. and 1000° C. appear to yield bonded wafers with as good a bond as those bonded at 1150° C., which is the bonding temperature in the method of FIGS. 2a–c.

Method with other oxidizers

The second preferred embodiment method of bonded wafer processing follows the steps of the first preferred embodiment method but augments or replaces the oxidizer of drop 305 by a silicon oxidizer such as aqueous $HClO_4$. For example, the drop could be 50% $HNO_3$, 20% $HClO_4$ and 30% $H_2O_2$, or 100% $HClO_4$. The same relatively low temperature bonding occurs, and the chlorine ends up bonded in the silicon interface nitrox or oxide layer. The chlorine provides an additional neutralizer for positive charge generated at the silicon interface due to radiation. In this sense, perchlorate is similar to nitrate in that it both oxidizes silicon and provides positive charge neutralization. Of course, other oxidizers of silicon such as $CrO_3$, $H_2Cr_2O_7$, ... can be used for the relatively low temperature bonding. These oxidizers will leave Cr, ... in the silicon interface bonded layer, and electronegative ones will aid radiation hardness by neutralizing positive charges.

Method with electronegative dopants

The third preferred embodiment method follows the steps of the first preferred embodiment method, but augments the oxidizer of drop 305 with radiation hardening dopants such as F, S, P, ... which will remain (at least in part) at the silicon interface during bonding. That is, in addition to $HNO_3$ for relatively low temperature bonding, drop 305 contains dopants such as HF, $H_2S$, $POCl_3$, ... which will generate electronegative dopants to neutralize radiation-generated positive charges as they arise. Thus oxidizers such as dichromate plus electronegative dopants could provide both the low temperature bonding plus radiation hardening. Alternatively, a high temperature bonding ($H_2O_2$ alone) with these dopants would provide a doped oxide bonded layer which included radiation hardening.

Method with buried layer dopants

The fourth preferred embodiment method follows the steps of the first preferred embodiment method, but augments the oxidizer of drop 305 with buried layer dopants such as As, P, B, Sb, ... which will diffuse into the bottoms of silicon islands 322, 323, ... during bonding and form buried layers. That is, in addition to $HNO_3$ for relatively low temperature bonding, drop 305 contains dopants such as $As_2O_3$, $POCl_3$, ... which will generate the electrically active dopants such as As, P, B, Sb, in the device wafer during bonding. A portion of these dopants will diffuse to form buried layer 420 as illustrated in FIG. 4 with device wafer 402, handle wafer 412, bottom oxide 416, and bonded nitrox 415. The doping concentrations of the buried layers in the silicon depends upon the quantity of dopants initially introduced into drop 305. For example, if drop 305 were 1% dopant, then the drop would provide a dose on the order of $10^{18}$ dopant atoms per $cm^2$ of interface. Thus drop 305 can easily accomodate sufficient dopants even if only a small fraction of the dopants actually migrate out of the bonding zone during nitrox layer growth. Indeed, implantation of a buried layer typically uses an implant dose on the order of $10^{16}$ dopant atoms/$cm^2$. Recall that nitrox is a diffusion barrier for various dopants. Bonding at 1000° C. will help diffuse the dopants in the silicon and may be useful with thicker silicon islands.

Of course, a high temperature bonding (e.g., $H_2O_2$ alone) with these dopants would also yield buried layers, but the high bonding temperatures would diffuse the dopant much further into islands 322, 323, ... and would not be useful for the case of very thin islands. For example, if islands 322, 323, ... were only 1 μm thick, then a 2–6 hours bonding at 1150° C. would drive dopants throughout the islands.

Method with multiple layers

FIGS. 5a–b show modifications of the starting wafers for first preferred embodiment wafer bonding method. In particular, FIG. 5a has device wafer 502 again with only native oxides, but handle wafer 512 has both 4000 A thick bottom thermal oxide 516 and 1000 A thick deposited nitrox layer 517. Nitrox layer 517 has the composition $Si_wO_xN_y$ with x approximately equal to 0.6 and y approximately equal to 0.4 and may be formed by decomposition of silane with ammonia and oxygen. Drop 505 is a solution of $HNO_3$ to provide oxidation of wafer 502 and bonding at 800°–1000° C. The resulting bonded wafer illustrated in FIG. 5b includes bonded nitrox layer 515 of approximate thickness 500–800 A and composition $Si_wO_xN_y$ with x approximately equal to 0.8 and y approximately equal to 0.2. The stack of bonded nitrox layer 515 on deposited nitrox layer 517 provides the advantages of (1) specifying the thickness and stoichiometry of buried nitrox 517 before deposition, (2) allowing a transition nitrox layer with different stoichiometry for matching stress and coefficients of thermal expansion, and (3) providing a barrier to contaminant diffusion if nitrox layer 517 is doped. Of course, dopants either for buried layers in device wafer 502 or for radiation hardening the bonded nitrox 515 or both could be included in the oxidizer drop 505.

Deposited nitrox 517 could be replaced with deposited and steam densified aluminum oxide (pseudo-sapphire) also of thickness about 1000 A. The bonded wafers would then be separated by a stack of dielectrics: nitrox 515 on aluminum oxide 517 which is on thermal oxide 516. This inclusion of nitrox 515 on top of aluminum oxide 517 has the advantages of (1) increased radiation hardness of pseudo-sapphire layer, (2) the presence of a diffusion barrier (nitrox 515) to keep the aluminum in 517 from diffusing into the device silicon, and (3) a more closely matched thermal coefficient of expansion of nitrox 517 to the bonding nitrox layer and silicon device wafer than aluminum oxide 517.

Method with additional silicon for bonding

FIG. 6 illustrates a variation of deposited nitrox/aluminum oxide layer 517 of FIG. 5a where additional silicon to aid the bonding has been included. In particular, handle wafer 612 has 4000 A thick bottom oxide 616, 500 A thick deposited nitrox or aluminum oxide 617, plus 300 A thick polysilicon layer 618. Again, drop 605 contains an oxidizing solution such as $HNO_3$ plus $H_2O_2$. Bonding liquid oxidizes polysilicon 618 to nitrox in a manner similar to the oxidation of the surface portion of wafer 602. In effect, the nitrox can form at both surfaces of the oxidizing liquid (drop 605 squeezed between the wafers). Drop 605 when uniformly spread over wafers 602 and 612 will form a layer about 6 µm thick and provide sufficient oxidizers to totally consume polysilicon layer 618 plus at least 300–500 A of device wafer 602. The advantage of polysilicon layer 618 is that (1) it supplied a source of silicon for the bonding liquid to react with to form nitrox in the bonding zone without consuming substantial amounts of device wafer 602 (which might be doped), (2) it can be polished to provide a smooth surface for bonding if the underlying deposited dielectrics are rough, and (3) it can be thermally oxidized before bonding to provide a layer of silicon oxide between the deposited dielectric, the bonding nitrox and device wafer 602.

Method with dielectric layers on both wafers

Figure 7A:
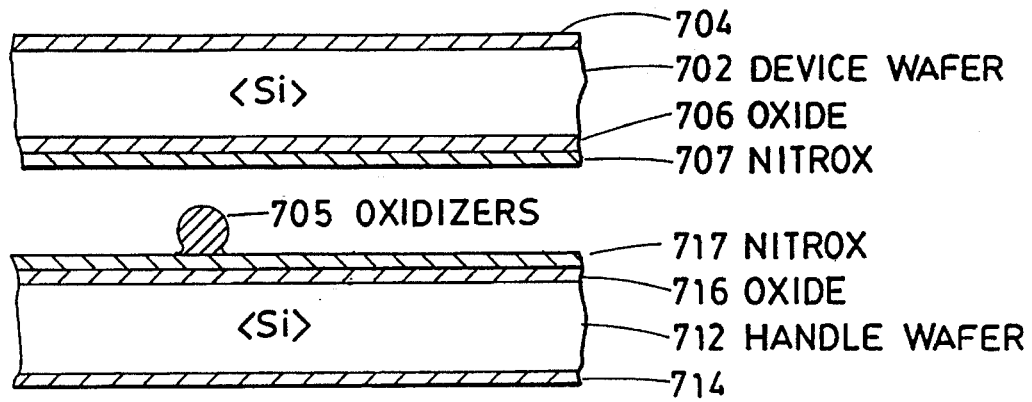
Figure 7B:
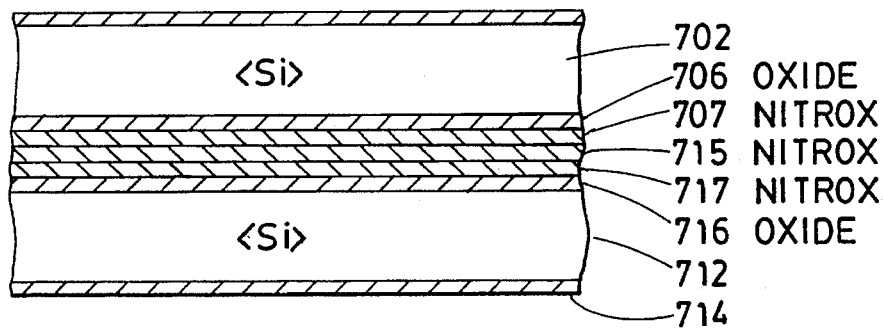

FIGS. 7a–b illustrate in cross sectional elevation views another preferred embodiment wafer bonding method; this method employs dielectric layers on both wafers and supplies the silicon for bonding as part of the bond process as follows.

(a) Begin with 6-inch diameter 600 µm thick silicon device wafer 702 and 6-inch diameter 600 µm thick silicon handle wafer 712. Device wafer 702 has the doping type and resistivity desired for eventual device fabrication. Grow thermal oxides 704 and 706 on device wafer 702 and oxides 714 and 716 on handle wafer 712. Oxide 716 will become the bottom oxide, so the oxide is grown to the desired bottom oxide thicknesss; for example, 1 µm. Oxide 714 provides stress compensation to restrain warpage. Deposit 1000 A thick silane-rich nitrox layer 717 on oxide 716 and silane-rich nitrox layer 707 on oxide 706 by a decomposition of silane with ammonia and oxygen. Nitrox layers 717 and 707 have the composition $Si_wO_xN_y$ with x approximately equal to 0.6 and y approximately equal to 0.4 plus unreacted silane ($SiH_4$). (Unreacted silane in the nitrox can be detected by infrared spectroscopy). Place drop 705 of oxidizing aqueous solution of $HNO_3$ and $H_2O_2$ on oxide 716; see FIG. 7a. Drop 705 is 50% by volume a 67% $HNO_3$ solution and 50% by volume a 30% $H_2O_2$ solution. Drop 705 has a volume of about 0.05 cc which implies 4.0 microliters per square inch of wafer surface and theoretically will spread out to a layer with thickness (if uniform) of 6 µm on oxide 716. Note that drop 705 wets the surface of nitrox 716. (Drop volume in the range of 4 to 10 microliters per square inch of wafer surface provides good bonding.)

(b) Press handle wafer 712 and device wafer 702 together with drop 705 of oxidizer on the surface of oxide 716. Let the pressed together wafers dry for 24 hours and then heat them to 800°–1000° C. in a 2–6 hour furnace cycle with an oxidizing ambient. This low temperature bonding does not drive rapid thermal oxidation as in the process of FIGS. 2a–c, but relies upon the electrochemical action of nitrate oxidizing the silicon of silane-rich nitrox 707 and 717 coupled with slow thermal oxidation. See FIG. 7b. Even though nitride is an oxidation barrier for silicon, the unreacted silane can diffuse from the film to react with the nitrate. The silane forms both silicon-oxygen and silicon-nitrogen bonds, and the water primarily evaporates. This creates bonded zone 715 of nitrox connecting nitrox 707 to nitrox 717, both now depleted of silane, and bonding the wafers. Bonded zone nitrox 715 has a thickness of roughly 500–800 Å µm and average values of x and y of roughly 0.8 and 0.2, respectively. Of course, increasing the ratio of $HNO_3$ to $H_2O_2$ will increase x and decrease y, and conversely for a decrease in the ratio.

(c) After bonding, remove the bulk of device wafer 702 and form isolated silicon islands for device fabrication as in the first preferred embodiment.

Method with dielectrics on both wafers plus additional silicon

Figure 8:
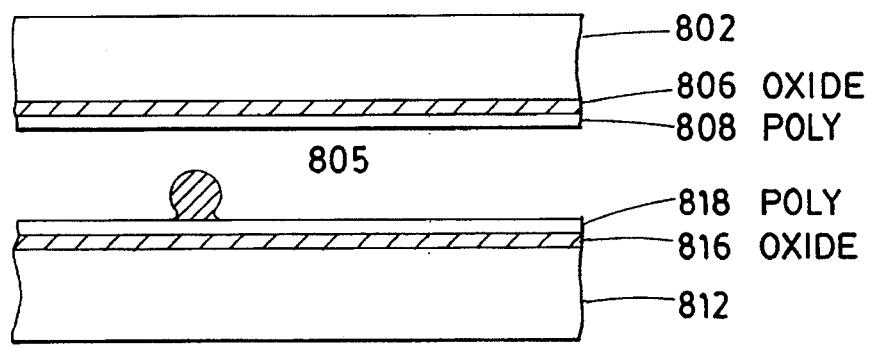

FIG. 8 illustrates the starting wafers for a further preferred embodiment method of wafer bonding. Device wafer 802 has thermal oxide layer 806 of thickness 0.1–0.4 µm and polysilicon layer 808 of thickness 500 Å. Similarly, handle wafer 812 has deposited or thermally grown dielectric layer 816 of thickness 1 µm and may have polysilicon layer 818 of thickness 500 Å. Drop 806 contains silicon oxidizer $HNO_3$. When wafers 802 and 812 are pressed together and heated to 800°–1000° C. for 2–4 hours, the nitrate reacts with the polysilicon to form silicon-nitrogen and silicon-oxygen bonds (nitrox) linking oxide 806 to oxide 816 and bonding the wafers. The quantity of nitrate in drop 805 matches the quantity of polysilicon in layers 808 and 818 for stoichiometric nitrox, as follows. 1000 Å total thickness of polysilicon provides about $3 \times 10^{17}$ atoms of silicon per $cm^2$. With $HNO_3$ the only oxidizer, the reaction generates nitrox 815 through the reaction:

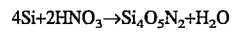

Thus about $1.5 \times 10^{17}$ molecules of $HNO_3$ are needed per $cm^2$. With drop 805 of volume spreading out to about 4 microliters per $cm^2$, the concentration of $HNO_3$ in drop 805 must be about $4 \times 10^{22}$ molecules per liter, or about 0.07M.

The use of polysilicon 808 and 818 as the source of silicon permits more rapid bonding because silicon need not diffuse through oxides 806 and 816 to react. Indeed, oxides 806 and 816 could be replaced in part by nitrides which would be barriers to oxidation of the underlying wafer silicon, but the bonding would still proceed using silicon from polysilicon 806 and/or 816.

Controlling the bonding liquid and overall dielectric thicknesses promotes unstressed chemical bonding gradients between the deposited dielectric(s) and the reacted dielectric. Maintaining minimum film thicknesses is critical in helping to eliminate localized stress caused by dissimilar dielectric materials. It is imperative that the bonding liquid provide the correct elements and oxidative potential to not etch the deposited dielectric, as well as create reacted layers with compatible coefficients of thermal expansion. This will allow a chemical bonding transition from the deposited dielectric(s) through the generated dielectric into the silicon. This is accomplished by controlling the elements in the bonding liquid, molar concentration ratios, solution volumes and bonding temperature.

Device characteristics

Figure 9:
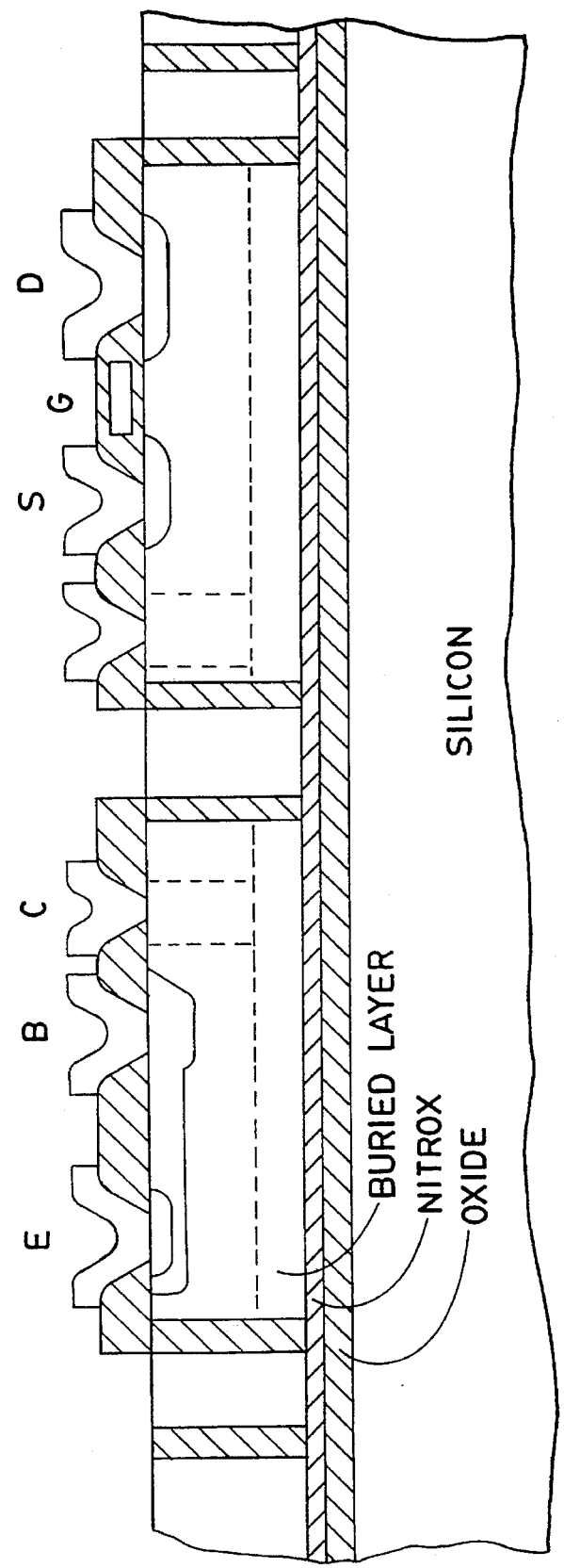
FIG. 9 shows in cross sectional elevation view a portion of a preferred embodiment integrated circuit.

Devices and integrated circuits fabricated in silicon-on-insulator of the bonded wafers of the preferred embodiment methods and then diced are schematically illustrated in cross sectional elevation view in FIG. 9 and have the following properties:

Radiation hardened buried insulators for increased radiation tolerance in military and space IC applications without the characteristics of implanted hardening: silicon crystal damage from implanting, conducting "pipes" in the buried dielectric which can result from surface particulates preventing the correct implant dosage from reaching the buried layer in the silicon to form a stoichiometric dielectric.

Tight buried layers due to no implant tailing, relatively low wafer bonding temperature, and no defect annealing.

Stress compensation due to incorporation of buried layers with closely matched thermal coefficients of expansion.

Layers which can function as diffusion barriers to limit the diffusion of mobile contaminants.

What is claimed is:

1. A bonded wafer integrated circuit, comprising:
  (a) a handle die having a dielectric layer;
  (b) a device silicon layer substantially free of nitrogen;
  (c) means for bonding the device silicon layer to the dielectric layer of said handle die, said means for bonding having a layer of silicon oxynitride; and
  (d) interconnected transistors in and at a surface of said device silicon layer.

2. The integrated circuit of claim 1, wherein:
  (a) said device silicon layer includes doped buried layers abutting said silicon oxynitride layer.

3. The integrated circuit of claim 1, wherein:
  (a) said handle die is silicon; and
  (b) said dielectric layer is silicon oxide.

4. The integrated circuit of claim 1 wherein the means for bonding is about 500–800 Angstroms thick.

5. The bonded integrated circuit of claim 1 wherein the device layer has a SIMS profile indicating less than 10,000 counts per second of nitrogen ions in said device layer.

* * * * *